United States Patent [19]

Lee

[11] Patent Number: 5,556,803
[45] Date of Patent: Sep. 17, 1996

[54] METHOD FOR FABRICATING A CHARGE COUPLED DEVICE

[75] Inventor: Kyung S. Lee, Seoul, Rep. of Korea

[73] Assignee: Goldstar Electron Co., Ltd., Chungchungbuk-do, Rep. of Korea

[21] Appl. No.: 480,720

[22] Filed: Jun. 7, 1995

Related U.S. Application Data

[62] Division of Ser. No. 354,740, Dec. 8, 1994.

[51] Int. Cl.$^6$ .................................................. H01L 21/70
[52] U.S. Cl. ............................ 437/53; 437/50; 437/40; 437/978
[58] Field of Search ............................ 437/53, 50, 40, 437/49, 978

[56] References Cited

U.S. PATENT DOCUMENTS

| 3,931,674 | 1/1976 | Amelio | 29/578 |
| 5,334,867 | 8/1994 | Shin et al. | 257/222 |
| 5,434,097 | 7/1995 | Shin et al. | 437/53 |

FOREIGN PATENT DOCUMENTS

| 0204165 | 12/1982 | Japan | 437/53 |
| 6-77457 | 3/1994 | Japan | |

*Primary Examiner*—Tuan H. Nguyen
*Attorney, Agent, or Firm*—Finnegan, Henderson, Farabow, Garrett & Dunner, L.L.P.

[57] ABSTRACT

A charged coupled device structure (CCD) and a method for fabricating the CCD structure, which induces a maximum potential distribution difference by utilizing gate insulation films having different physical properties. The charged coupled device includes a semiconductor substrate, a first insulation layer formed on the semiconductor substrate, a plurality of first electrodes spaced at fixed intervals over the first insulation layer, a second insulation layer formed only between the plurality of first electrodes and the first insulation layer, a third insulation layer formed over the entire exposed surface of the first electrodes and the first insulation layer, and a plurality of second electrodes formed only on the surface area corresponding to spaces between the plurality of first electrodes. This gate insulation layers having different physical properties induces a maximum potential distribution difference in a semiconductor substrate with a dielectric constant difference between the insulation layers.

3 Claims, 8 Drawing Sheets

METHOD FOR FABRICATING A CHARGE COUPLED DEVICE

This is a division of application Ser. No. 08/354,740, filed Dec. 8, 1994.

BACKGROUND OF THE INVENTION

1. Field of the Invention

This invention relates to a charge coupled device (hereinafter called CCD) and a method for fabricating the CCD, and, more particularly, to a CCD structure and a method for fabricating the CCD structure, which can induce a maximum potential distribution difference using gate insulation films having different physical properties.

2. Discussion of Related Art

The CCD used in a solid state picture device and a signal delay device transfers signals to a place under adjacent electrodes using a potential difference in the semiconductor induced by potential applied to each of the gate electrodes. Such a CCD is an arrangement of transfer electrodes over a semiconductor substrate separated by a gate insulation film.

Materials used for forming the transfer electrodes are mostly polysilicon doped or injected with high density impurities. The separation between each of the electrodes is a silicon oxide film, an insulating material oxidized in an oxygen or water vapor atmosphere.

A conventional CCD is to be explained with reference to the attached drawings.

FIG. 1 is a section of a conventional CCD. First transfer electrodes 34 are formed by forming a BCCD (Buried CCD) region 32 of a charge transfer region by injecting n type impurity ions into a p type semiconductor substrate 31, overlaying an oxide film 33 over the entire exposed surface, depositing polysilicon on the oxide film 33, and etching the polysilicon in a certain lateral length by a photoetching process.

Barriers 39 are formed on the surface of the BCCD region 32 by ion injection, using the first transfer electrodes 34 as masks. After the first transfer electrodes 34 are insulated with an oxide film, second transfer electrodes 35 are formed of polysilicon between each of the first transfer electrodes 34.

Adjacent first transfer electrodes 34 and second transfer electrodes 35 are applied with first and second clock signals H$\phi$1 and H$\phi$2, alternatively.

FIGS. 2(a) and 2(b) depict the operating principle of a conventional 2 phase CCD. FIG. 2(a) represents an example of first and second clock signals applied to electrodes of the 2 phase CCD. FIG. 2(b) shows the distribution of potential induced in a semiconductor for the first and second clock pulses to the transfer electrodes and the subsequent transfer process of charges.

At time t=1, the first clock signal H$\phi$1 is low, and the second clock signal H$\phi$2 is high. A potential well is deepest under the first transfer electrodes 34 to which the second clock signal H$\phi$2 is applied, and signal charges are locked up in potential wells under those first transfer electrodes 34.

At time t=2, the first clock signal H$\phi$1 is high, and the second clock signal H$\phi$2 is low. The deepest potential wells are formed under those first transfer electrodes 34 to which the first clock signal H$\phi$1 is applied. The potential wells of the second transfer electrodes 35, which have the second clock signal H$\phi$2 applied, are higher, resulting in a charge transfer to the deepest potential wells under those first transfer electrodes 34 which have the first clock signal H$\phi$1 applied. At time t=3, the charge transfers are the same as at time t=1.

Transfer of the signal charges are directional, and transfer only to the right side due to the potential barrier formed under the left side electrode in a pair of transfer electrodes. When a series of first and second clock pulses H$\phi$1 and H$\phi$2 are repeated, there is a transfer of signal charges.

FIG. 3 shows a section of a self align CCD disclosed in U.S. Pat. No. 3,931,674, including a first insulation layer 24, and a second insulation layer 26 formed on a semiconductor substrate 20, an array of conductive films 43, 45, 47, 49 and 51 corresponding to first electrodes arranged at a certain lateral spacing, barrier regions 44, 46, 48 and 50 formed by an ion injection process on parts of the surface of the substrate, and third insulation layers 53 formed on the first electrodes for electric separation of the first electrodes from the second electrodes 84, 86, 88 and 90.

The CCD of FIG. 3 is fabricated by forming the first insulation layer 24, the second insulation layer 26, the first electrodes 43, 45, 47 and 51, and by forming the barrier regions 44, 46, 48 and 50 by injecting impurity ions having a conductive type opposite to the substrate into the surface parts of the semiconductor substrate. When the same voltage is applied to the first electrodes and the adjacent second electrodes 84, 86, 88 and 90, a difference of maximum potential distribution develops due to the difference of impurity density on the surface of the semiconductor under each electrode, and charges are transferred.

Since the conventional art requires an ion injection process for forming barrier regions to induce maximum potential difference at the semiconductor substrate, defects develop inside of the oxide film of the gate insulation film, and at the surface parts of the semiconductor substrate. There is the possibility of degradation of the element characteristics, and to decrease degradation, a complicated process of annealing with heat is required.

SUMMARY OF THE INVENTION

The present invention has been made in view of the above circumstances and has as an object to provide a CCD which has excellent characteristics by a simple process of forming gate insulation layers of insulation films having different physical properties which will induce a maximum potential distribution difference in a semiconductor substrate with a dielectric constant difference between the insulation layers.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the CCD of this invention comprises, a semiconductor substrate, a first insulation layer formed on the semiconductor substrate, a plurality of first electrodes spaced at fixed intervals over the first insulation layer, a second insulation layer formed only between the plurality of first electrodes and the first insulation layer, a third insulation layer formed over the entire exposed surface of the first electrodes and the first insulation layer, and a plurality of second electrodes formed on portions of the surface of the third insulation layer that overly an upper side of the spaces between the plurality of first electrodes.

The invention further includes a method for fabricating a changed coupled device (CCD) comprising steps for forming a first insulation layer on a semiconductor substrate, forming a second insulation layer on the first insulation layer, the second insulation layer has different physical properties than the first insulation layer, forming a first conductive layer on the second insulation layer, patterning the first conductive layer and the second insulation layer to form a plurality of first electrodes, forming a third insulation layer on the entire surface of the substrate, the third insulation layer has different physical properties than the second insulation layer, forming a second conductive layer on the third insulation layer and forming second electrodes on portions of the surface of the third insulation layer that overly on upper side of the spaces between the plurality of first electrodes by patterning the second conductive layer.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings.

DESCRIPTION OF THE PREFERRED EMBODIMENTS

Figure 1:
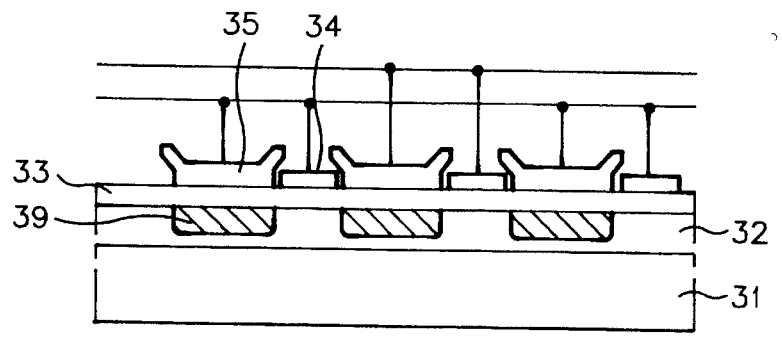
FIG. 1 is a sectional view of a conventional CCD.
Figure 2A:
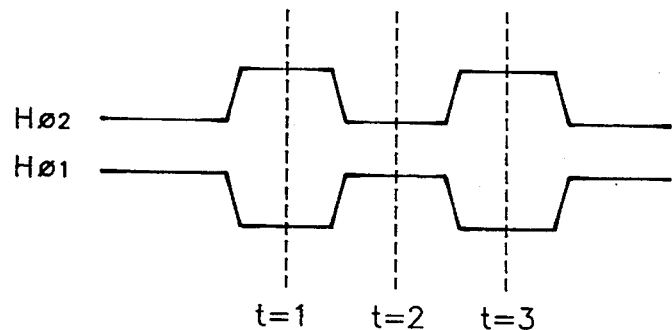
FIGS. 2(a)–2(b) show the operation principle of a conventional 2 phase CCD.
Figure 2B:
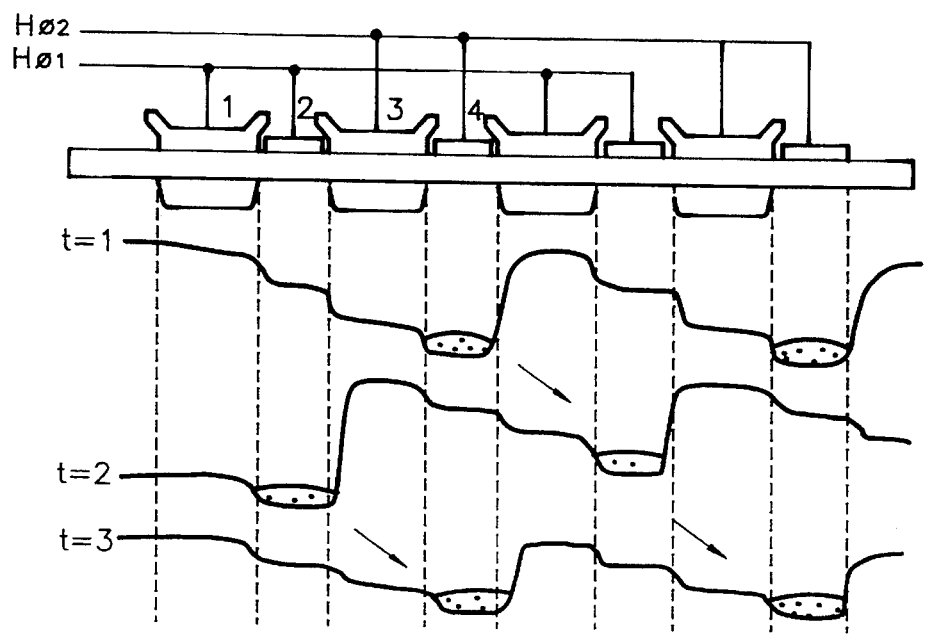
Figure 3:
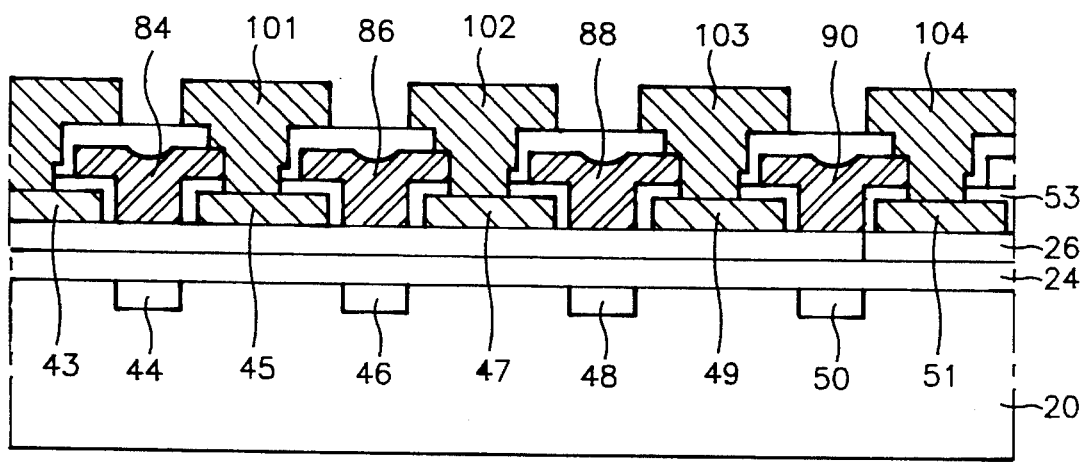
FIG. 3 is a sectional view of another conventional CCD.
Figure 4A:
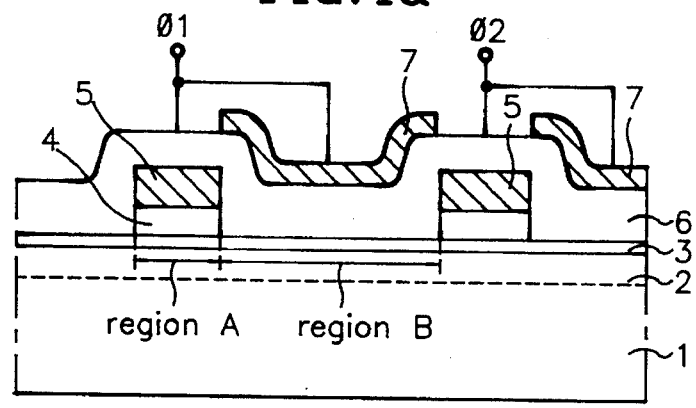
FIGS. 4(a)–4(c) are schematic and graphic representations of a CCD in accordance with this invention.
Figure 4B:
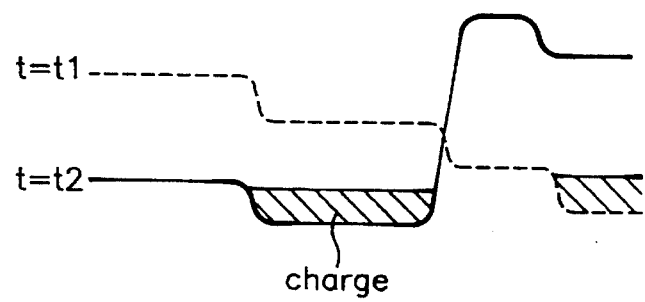
Figure 4C:
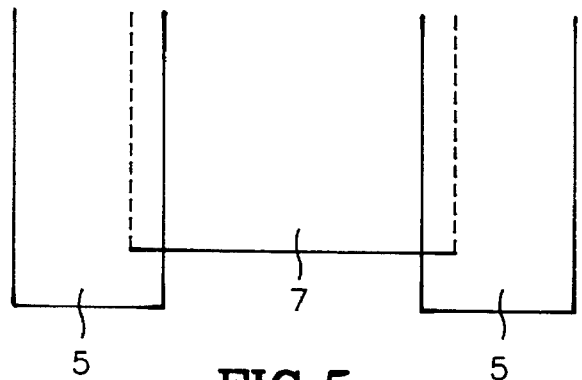

A CCD in accordance with this invention, having buried channels, is shown in FIGS. 4(a)–4(c). In FIG. 4(a), the CCD in accordance with this invention is shown to include a surface impurity layer 2 formed on a part of a surface of a semiconductor substrate 1. The surface impurity layer 2 has a conductivity opposite to that of the substrate 1. A first insulation layer 3 is formed on the surface impurity layer 2. A plurality of structures, each having a stack of a second insulation layer 4 and a first electrode 5, are arranged in a fixed spacing interval on the first insulation layer 3. A third insulation layer 6 is formed between the first electrodes 5 and second electrodes 7 for isolating the second electrodes 7 formed above the first electrodes 5 from the first electrodes 5.

As shown in FIG. 4(c) in a plan view, a part of each of the second electrodes 7 is overlapped by two first electrodes 5.

The first and the second insulation layers 3 and 4 are formed of materials having different physical properties. For example, the first insulation layer 3 may be an oxide film ($SiO_2$) formed by heat, and the second insulation layer 4 may be a nitride film ($Si3N4$) formed by heat.

The first insulation layer 3 and the third insulation layer 6 are formed of insulation materials having the same physical properties but are formed by different methods. For example, the first insulation layer 3 may be an oxide film formed by heat, and the third insulation layer 6 may be an oxide film formed by a CVD (chemical vapor deposition) method.

According to a reference paper "Charge-coupled devices and their application, 1980, McGraw-Hill Book Company", the potential distribution equation for actuating a CCD can be expressed, in the case of a CCD having a surface channel structure, as, $$\phi s = V_G + (Q_{INV}/Cox)$$

and in the case of a CCD having a buried channel structure, as, $$Vz = V_G + (qN_D X1/Cox) + (qN_D X1^2/2\epsilon S)$$

wherein, $\phi s$ is the surface potential distribution, $V_G$ is the voltage applied to a gate electrode, $Q_{INV}$ is the charge density of a inversion layer, Cox is the capacitance in relation to an insulation layer under a gate, Vz is the potential of a buried channel, and $N_D$ is the impurity density under the buried channel.

This invention relates to Cox in the above equation and to the operation of the CCD after varying the Cox. A dielectric constant $\epsilon ox$ is varied in $Cox = \epsilon ox(Aox/tox)$ where $\epsilon ox$ is the dielectric constant and Aox is surface area of the insulation layer.

As shown in FIG. 4(a), if the first insulation layer 3 is formed of an oxide film and the second insulation layer 4 is formed of a nitride film, the dielectric constants of the oxide film and the nitride film are 3.9 and 7.5 respectively, when the nitride film is used for the insulation layer, since the capacitance Cox becomes greater compared to use of an oxide film, and $\phi s$ and Vz become smaller.

By providing different dielectric constants for the insulation layers under the first electrodes 5 and the second electrodes 7, and inducing a maximum potential distribution difference in the semiconductor under each electrode, charge transfer will occur.

Figure 5:
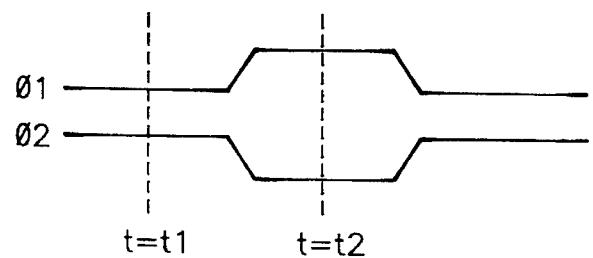
FIG. 5 is a timing chart showing input wave patterns applied to the CCD in accordance with this invention.

If the wave pattern input of FIG. 5 is applied to the CCD structure of FIG. 4(a), the potential distribution shown in FIG. 4(b) at t=t1 and t=t2 will be obtained, and charge transfer will occur.

Figure 6:
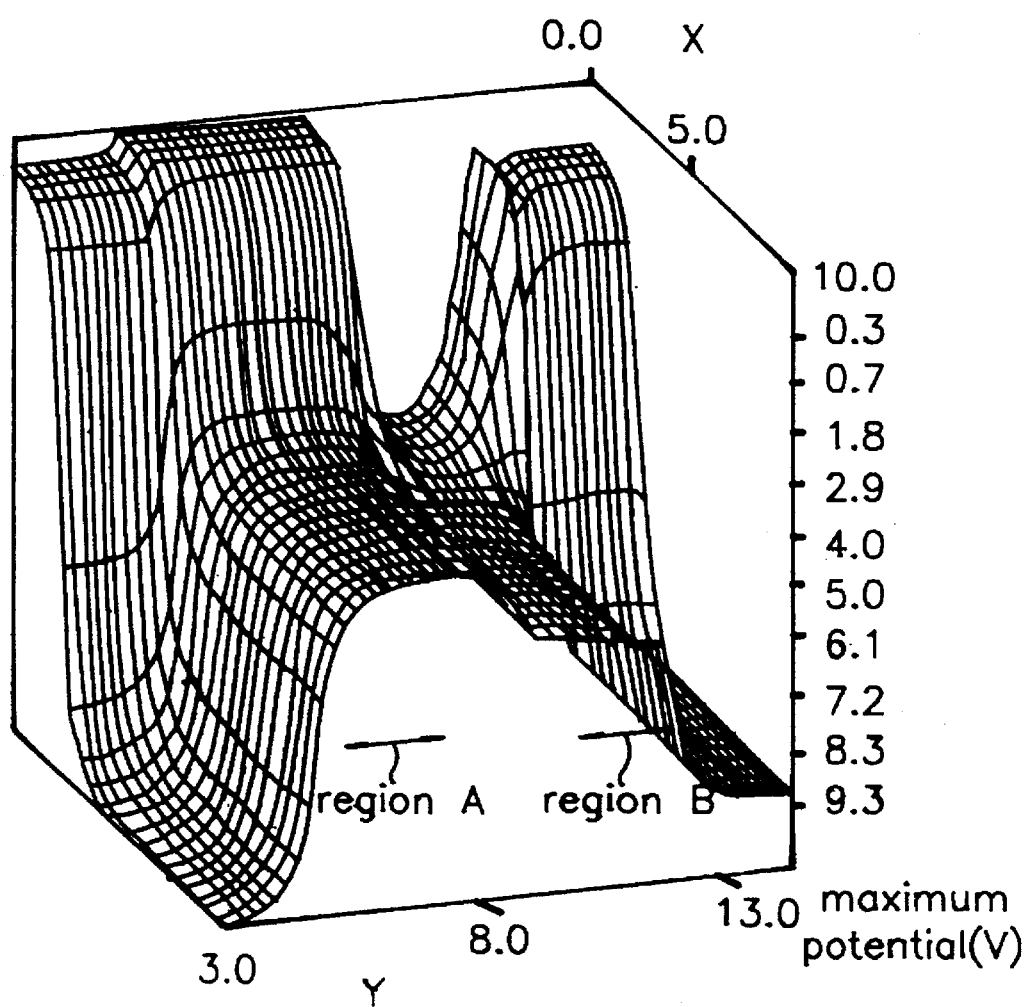
FIGS. 6 and 7 are prospective views showing the results of simulation of maximum potential distribution in regions at the substrate surface under the CCD electrodes in accordance with this invention.
Figure 7:
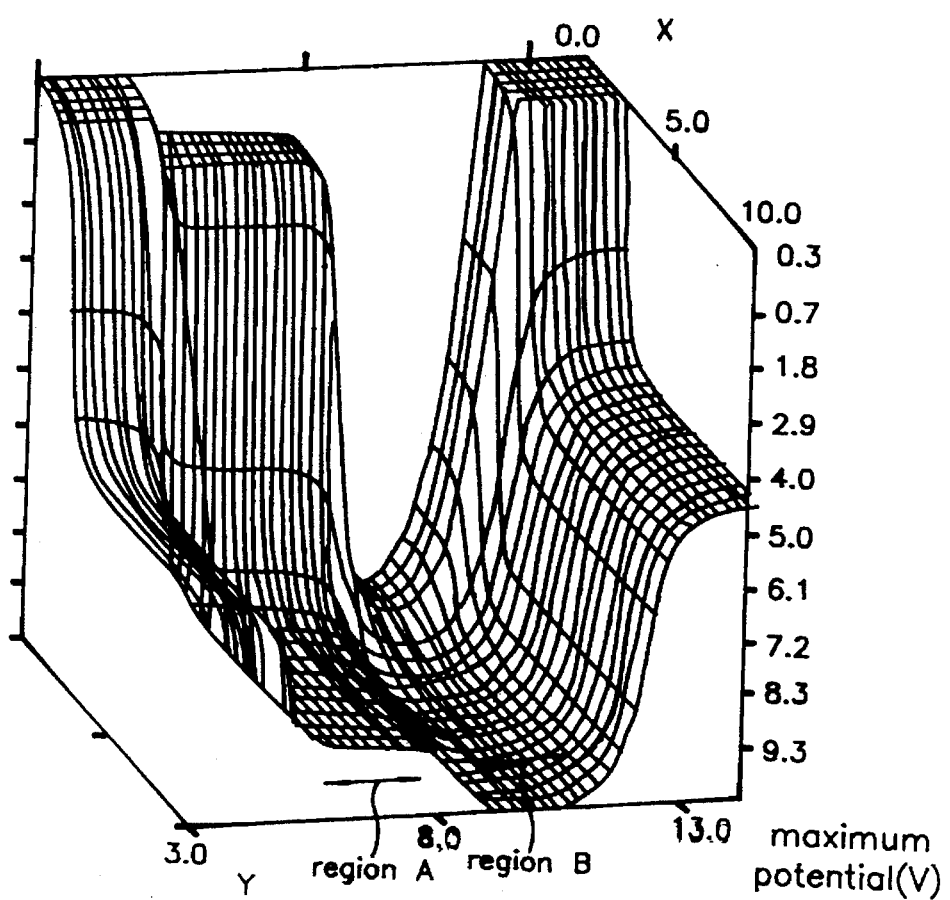

FIGS. 6 and 7 show the results of the simulation for maximum potential distribution in the substrate regions under each kind of the electrodes, i.e., regions A and B using simulation equipment of SPECTRA.

Figure 8:
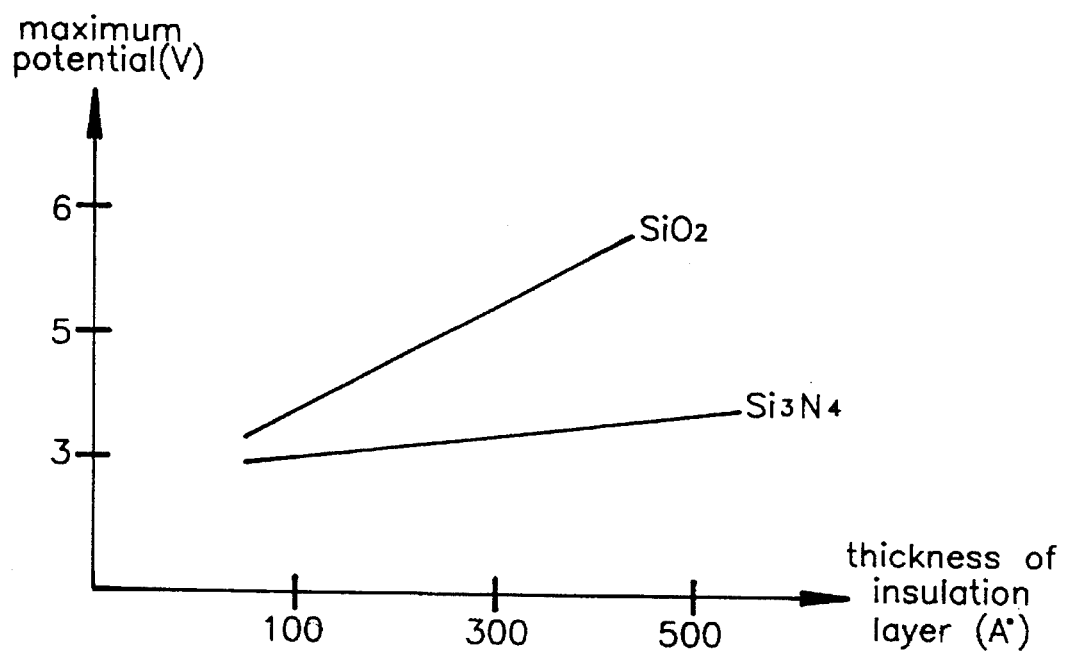
FIG. 8 is a graph showing the relationship of the maximum potential to the thickness of the CCD insulation layer in accordance with this invention.

FIG. 6 shows a maximum potential distribution for a thickness of an oxide film of the first and third insulation layers of 650 Å, a thickness of a nitride film of the second insulation layer of 500 Å, and a voltage applied to the gate electrode of 0 V. FIG. 7 shows a maximum potential distribution for a thickness of an oxide film of the first and third insulation layers of 650 Å, a thickness of a nitride film of the second insulation layer of 500 Å, and a voltage applied to the gate electrode of 5 V. The relationship between the thickness of the insulation layers and the maximum potential are shown in FIG. 8.

A method for fabricating a CCD in accordance with this invention will now be explained with reference to FIG. 9(a)–(d).

Figure 9A:
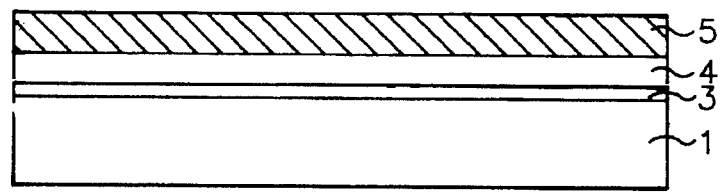
FIGS. 9(a)–9(d) are schematic cross-sections representing steps in a method for fabricating a CCD in accordance with this invention.

First, as shown in FIG. 9(a), an oxide film is formed on a semiconductor substrate 1 with a thermal oxidation process as a first insulation layer 3, on which a nitride film, for example, is formed as a second insulation layer 4, and on which a first electrode 5 is deposited as a first conduction layer for forming a first electrode.

Figure 9B:
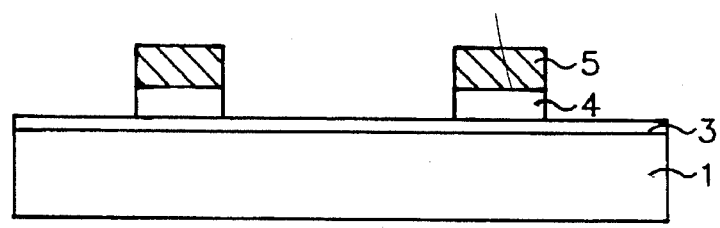
Figure 9C:
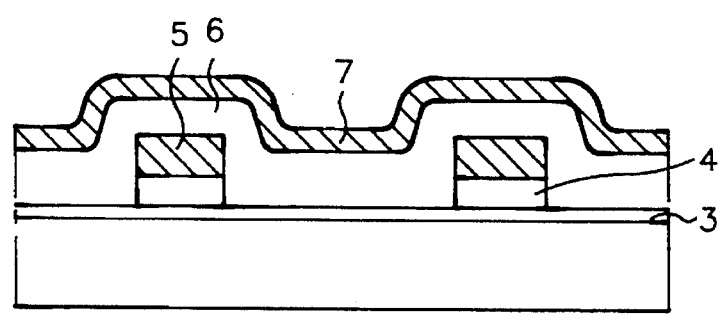

Next, as shown in FIG. 9(b), the polysilicon layer and the nitride film are subjected to patterning. As shown in FIG. 9(c), an oxide film is used as the first electrodes and is deposited over the entire surface of the substrate including the first electrode 5, a third insulation layer 6 formed by a CVD method, and a second electrode 7 deposited on the third insulation method as a second conduction layer for forming a second electrode.

Figure 9D:
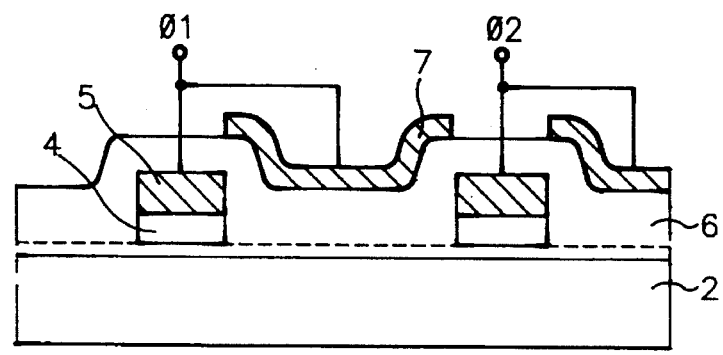
Figure 9D:
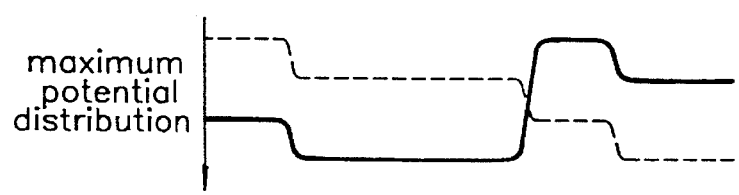

As shown in FIG. 9(d), after patterning the second conduction layer with a photoetching process using a designated pattern, to form the second electrode 7, the process for fabricating a CCD is complete.

Figure 10:
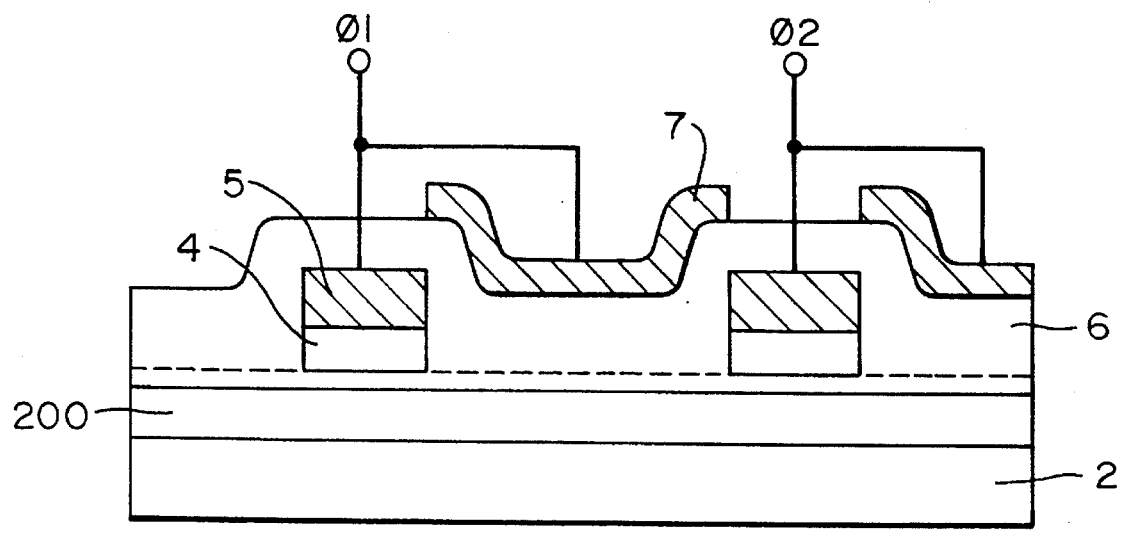
FIG. 10 illustrates a further embodiment of the present invention including a buried channel structure.

To apply this invention to a CCD having a buried channel structure as shown in FIG. 10, the CCD can be fabricated by forming an opposite conduction type impurity region 200 on the surface of the substrate, and then proceeding with the processes shown in FIGS. 9(a)–9(d).

As has been explained, this invention has the advantage of a simplified process of making a CCD and reducing the defects in a substrate caused by the conventional ion injection, permitting elimination of processes such as annealing, by inducing a maximum potential distribution to cause charge transfer, by using insulation layers having different dielectric constants, rather than by forming a barrier region with impurity ion injection onto a surface of the substrate.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were (was) chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for fabricating a charged coupled device (CCD) comprising the steps of:

forming a first insulation layer on a semiconductor substrate;

forming a second insulation layer on the first insulation layer, said second insulation layer has a first thickness, a first dielectric constant, and different physical properties than said first insulation layer;

forming a first conductive layer on the second insulation layer;

patterning the first conductive layer and the second insulation layer to form a plurality of spaced first electrodes;

forming a third insulation layer on the entire surface of the substrate, said third insulation layer has a second thickness greater than said first thickness, a second dielectric constant less than said first dielectric constant, and different physical properties than said second insulation layer;

forming a second conductive layer on the third insulation layer; and forming second electrodes on a portion of the surface of the third insulation layer that overlies an upper side of spaces between the plurality of first electrodes by patterning the second conductive layer.

2. The method as claimed in claim 1, wherein the first insulation layer and the third insulation layer are formed of oxide films, and the second insulation layer is formed of a nitride film.

3. The method as claimed in claim 2, wherein the first insulation layer is formed with a thermal oxidation process, and the third insulation layer is formed with a chemical vapor deposition process.

* * * * *